United States Patent [19]
Kunishi et al.

[11] Patent Number: 5,367,431
[45] Date of Patent: Nov. 22, 1994

[54] THIN POWER SUPPLY UNIT

[75] Inventors: Tatsuo Kunishi; Kouichi Watanabe; Masanori Endo; Masato Higuchi, all of Kyoto, Japan

[73] Assignee: Murata Manufacturing Co., Ltd., Japan

[21] Appl. No.: 964,785

[22] Filed: Oct. 22, 1992

[30] Foreign Application Priority Data

Oct. 23, 1991 [JP] Japan ................... 3-275424

[51] Int. Cl.$^5$ .................... H01G 9/00; H01G 1/035
[52] U.S. Cl. .................... 361/502; 361/782; 361/522; 361/329; 174/260; 174/264
[58] Field of Search .............. 361/502, 522, 541, 328, 361/329, 330, 738, 749, 750, 760, 766, 782, 811, 821; 174/250, 254, 260, 262, 265, 264, 263

[56] References Cited

U.S. PATENT DOCUMENTS

| | | | |
|---|---|---|---|
| 2,703,853 | 3/1955 | Chrystie | 361/750 |
| 3,040,119 | 6/1962 | Granzow | 174/264 |
| 3,601,523 | 8/1971 | Arndt | 174/264 |
| 3,766,439 | 10/1973 | Isaacson | 361/750 |
| 4,383,363 | 5/1983 | Hayakawa et al. | 174/264 |
| 4,873,397 | 10/1989 | Masujima et al. | 361/760 |
| 4,883,920 | 11/1989 | Tanabe et al. | 174/263 |
| 5,012,385 | 4/1991 | Kurabayashi et al. | 361/502 |
| 5,187,564 | 2/1993 | McCain | 174/260 |

FOREIGN PATENT DOCUMENTS 2007563 12/1970 Germany .
1140553 6/1989 Japan .

OTHER PUBLICATIONS

German Office Action, Dec. 2, 1993.

*Primary Examiner*—Bruce A. Reynolds
*Assistant Examiner*—Gregory L. Mills
*Attorney, Agent, or Firm*—Ostrolenk, Faber, Gerb & Soffen

[57] ABSTRACT

A plurality of flat power supply elements, each having a flat case for serving as an element terminal and an electrode plate arranged in the case in a close contact manner through an insulating layer for serving as another element terminal. An opening formed in the case for partially exposing the electrode plate. The flat power supply elements are bonded onto a flexible circuit board by an insulating bonding layer. A first external connection terminal which is provided on the circuit board is connected to the electrode plate of one power supply element through a first conductive member. A connecting conductor which is also provided on the circuit board is electrically connected to the case of this one power supply element through a second conductive member and connected to the electrode plate of another power supply element through a third conductive member. A second external connection terminal which is provided on the circuit board is electrically connected to the case of this another power supply element through a fourth conductive member. Thus, a plurality of flat power supply elements having excellent sealing structures are combined with each other to provide an integrated thin power supply unit with no increase in thickness.

20 Claims, 9 Drawing Sheets

THIN POWER SUPPLY UNIT

BACKGROUND OF THE INVENTION

1. Field of the Invention

The present invention relates to a thin power supply unit which is formed by a plurality of flat power supply elements such as electric double layer capacitors or batteries, for example, each comprising a case having a flat shape as a whole. More particularly, the present invention relates to an improvement in the arrangement of a plurality of flat power supply elements.

2. Description of the Background Art

With recent development of the semiconductor technique, not only industrial but consumer apparatuses generally carry CPUs. In such apparatuses, programs and data are stored in a RAM, which must be regularly supplied with a voltage of at least about 2 V for the purpose of memory protection. Such a voltage for memory protection is supplied from a power supply, which is suitably formed by a lithium battery or an electric double layer capacitor.

In general, a lithium battery contains a nonaqueous electrolytic solution which is prepared by dissolving an electrolyte of lithium perchlorate or the like in an organic solvent such as propylene carbonate or gamma-butyrolactone. Such an electrolytic solution is preferably applied also to an electrolytic double layer capacitor, since it is thereby possible to set the withstand voltage at a high value.

However, when the water content is increased in a system employing such a nonaqueous electrolytic solution, the internal resistance is increased and the withstand voltage is reduced thereby deteriorating the performance. Therefore, it is necessary to maintain the system in a highly dehydrated state.

With recent reduction in size, thickness and weight of electronic apparatuses, reduction is increasingly required also in the size and thickness (height) of a backup power supply which is carried on such electronic apparatuses. In particular as to the thickness, the power supply must be smaller than the armoring height of a general semiconductor device.

Figure 9:
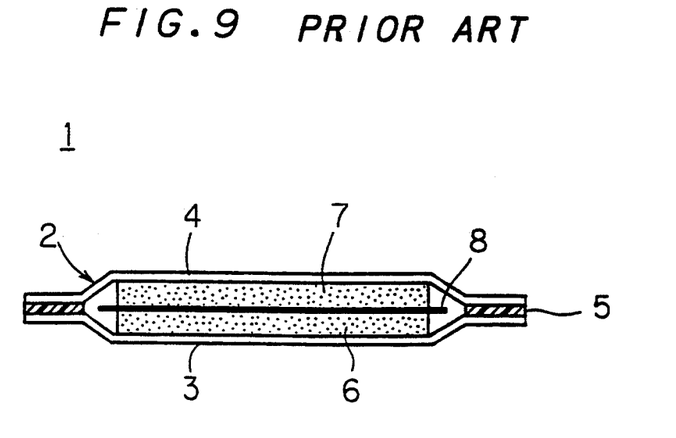
FIG. 9 is a sectional view showing a prior art flat power supply element 1.

FIG. 9 shows a prior art power supply element which satifies the aforementioned requirement for reduction in height. Such a prior art power supply element has the structure of the so-called "paper lithium battery" or a structure corresponding to it. Referring to FIG. 9, a flat power supply element 1 comprises a flat case 2, which is provided with first and second case halves 3 and 4 formed by metal plates or foils of for example, stainless steel or the like. Peripheral edges of the first and second case halves 3 and 4 are bonded to each other by a sealing material 5 of an organic substance such as for example, a thermobonding film, whereby the case 2 has a closed structure. The case 2 is provided therein with first and second functional materials 6 and 7 which hold a separator 8, containing an electrolytic solution, therebetween. The first and second functional materials 6 and 7 are positive and negative electrode active materials when the power supply element 1 is a battery; while the first and second functional materials 6 and 7 are first and second polarizable electrodes when the power supply element 1 is an electric double layer capacitor. In the prior art power supply element 1, the first and second case halves 3 and 4 are electrically insulated from each other by the sealing material 5, while the first case half 3 is electrically in contact with the first functional material 6 and the second case half 4 is electrically in contact with the second functional material 7. Thus, the first and second case halves 3 and 4 serve as first and second element terminals, respectively.

In the prior art power supply element 1, it is possible to ignore the permeation of moisture inside the first and second case halves 3 and 4 themselves. However, the sealing material 5, which is prepared from an organic substance as hereinabove described, tends to allow the permeation or penetration of moisture and the vaporization of the electrolytic solution which is contained in the element, thereby leading to an inferior sealing of the prior art power supply element 1. Thus, the power supply element 1 of the prior art has only a short life, and the potential for using the element 1 is extremely limited.

In order to improve the sealing of the power supply element 1, Japanese Patent Application No. 62-296879 (1987) (Japanese Patent Laid Open Application No. 1-140553 (1989)), filed by the assignee of the present invention, proposes a flat power supply element of a closed structure with high sealability.

Figure 10:
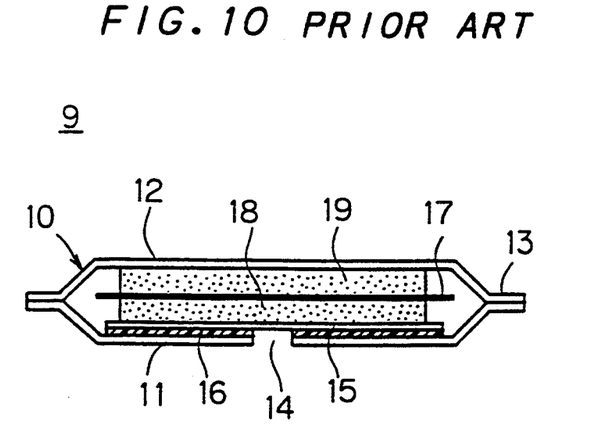
FIG. 10 is a sectional view showing another prior art flat power supply element 9.

FIG. 10 is a sectional view showing a flat power supply element 9 according to an embodiment of the aforementioned Japanese prior art reference. Referring to FIG. 10, a case 10 of the flat power supply element 9 comprises first and second case halves 11 and 12 of for example stainless foil. The case halves 11, 12 have peripheral edge portions 13 which are welded to each other to seal the case 10. The first case half 11 is provided with an opening 14, and an electrode plate 15 of stainless foil, for example, is arranged to face this opening 14. The electrode plate 15 and the first case half 11 are insulated from each other and sealed by an insulating layer 16 which is made, for example, of resin. The case 10 which is closed in the aforementioned manner is provided therein with first and second functional materials 18 and 19, which hold a separator 17 therebetween.

According to the aforementioned structure shown in FIG. 10, the insulating layer 16 can be sufficiently increased in width substantially with no increase in the outside dimension of the power supply element 9, whereby it is possible to further effectively prevent permeation and penetration of moisture as well as vaporization of an electrolytic solution. According to the prior art flat power supply element 9, therefore, it is possible to attain remarkable improvement in life and reliability of the power supply element 9.

However, the prior art structure shown in FIG. 10 still has a problem to be solved.

A battery or an electric double layer capacitor is primarily used as a main power supply, a power supply for memory protection or an auxiliary power supply for battery exchange. The rated voltage and capacitance of the battery or double layer capacitor are varied with the application. In particular, the rated voltage is usually set at 5 to 6 V since the supply voltage for a generally employed semiconductor element is mainly 5 V, while an auxiliary power supply for battery exchange requires a higher rated voltage of about 7 V in response to the maximum voltage of the battery. The aforementioned prior art power supply elements 1 or 9 however, can attain only a low rated voltage of about 1.2 to 3.6 V for a battery, or a rated voltage of about 0.9 to 2.8 V for an electric double layer capacitor. Thus, it is necessary to connect a plurality of such power supply elements 1 or 9 in series to each other, in response to the desired rated voltage.

However, it is extremely difficult to connect a plurality of flat power supply elements 9 shown in FIG. 10, since the electrode plate 15 which serves as an element terminal in each element 9 is exposed only in the opening 14 which is provided in the case 10.

SUMMARY OF THE INVENTION

Accordingly, an object of the present invention is to provide an electrically connected and mechanically integrated thin power supply unit by combining a plurality of flat power supply elements each having an excellent sealing structure such as that shown in FIG. 10, for example, with no extreme increase in thickness.

The thin power supply unit according to the present invention comprises a plurality of flat power supply elements, each having a flat case for serving as an element terminal and an electrode plate which is arranged in the case in a close contact manner through an insulating layer for serving as another element terminal. An opening is formed in the case for partially exposing the electrode plate, similarly to the flat power supply element 9 shown in FIG. 10.

The inventive thin power supply unit further comprises plate type circuit means, which is provided with external connection terminals. The circuit means electrically connects the plurality of flat power supply elements with each other as well as with the external connection terminals. The plurality of flat power supply elements are bonded to the circuit means through an insulating bonding layer. In order to enable electrical conduction between the flat power supply elements and the circuit means, the bonding layer is partially provided with broken portions such as through holes, for example.

The bonding layer is preferably formed by a thermobonding resin film. On the other hand, the circuit means is preferably formed by a flexible circuit board, or a metal plate or foil.

According to the present invention, the plate type circuit means supplies the plurality of flat power supply elements with desired electrically connected states, and provides mechanical holding means for the plurality of flat power supply elements with the insulating bonding layer. The circuit means further provides external connection terminals for the overall flat power supply elements.

According to the present invention, therefore, it is possible to obtain a thin power supply unit by combining a plurality of flat power supply elements with no extreme increase in thickness, since the plurality of flat power supply elements are arranged along the surface of the plate type circuit means.

Further, it is possible to easily and arbitrarily connect a plurality of flat power supply elements in series to each other for increasing the rate voltage, or in parallel with each other for increasing the capacitance, by simply changing an interconnection pattern supplied by the circuit means.

In addition, the electrode plates which are arranged in the cases of the respective flat power supply elements can be drawn out toward the external connection terminals which are provided in the circuit means, whereby electrical connection with a circuit board of an electronic apparatus can be easily attained through the external connection terminals.

The foregoing and other objects, features, aspects and advantages of the embodiments of the present invention will become more apparent from the following detailed description of the embodiments of the present invention when taken in conjunction with the accompanying drawings.

BRIEF DESCRIPTION OF THE DRAWINGS

FIG. 4(a) is a perspective view showing a thin power supply unit 20a according to a second embodiment of the present invention, FIG. 4(b) is a perspective view showing a flexible circuit board 21a, and FIG. 4(c) is a sectional view along the line C—C in FIG. 4(a);

FIG. 6(a) is a perspective view showing a thin power supply unit 38a according to a fourth embodiment of the present invention, FIG. 6(b) is a perspective view showing a flexible circuit board 39a, FIG. 6(c) is a sectional view along the line C—C in FIG. 6(a), and FIG. 6(d) is a sectional view along the line D—D in FIG. 6(a);

DESCRIPTION OF THE PREFERRED EMBODIMENTS

Figure 1:
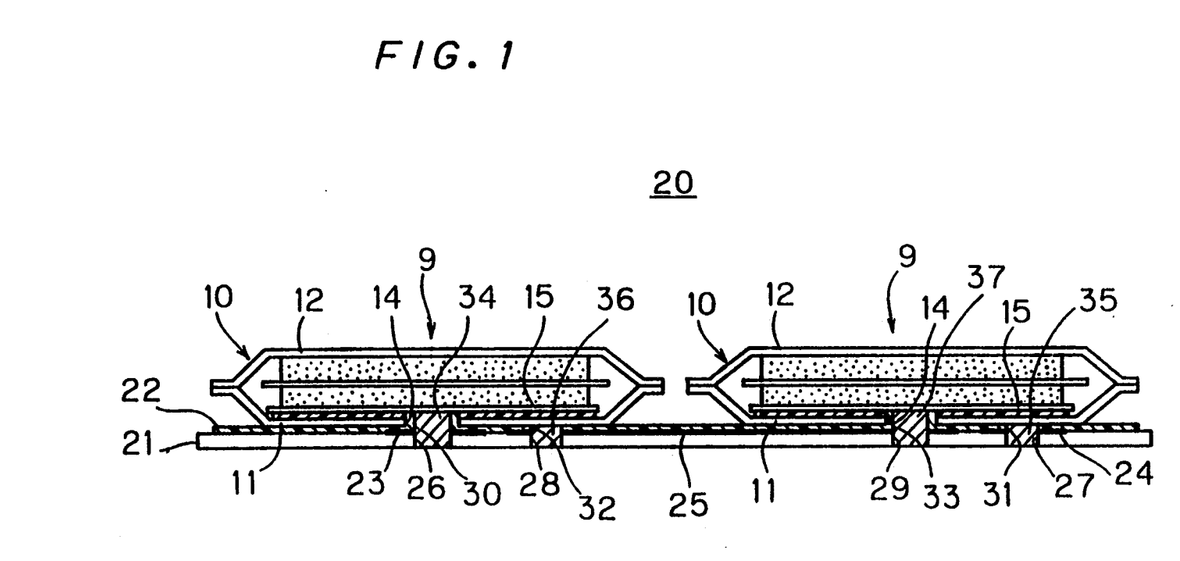
FIG. 1 is a sectional view taken along the line I—I in FIG. 2, showing a thin power supply unit 20 according to a first embodiment of the present invention.
Figure 2:
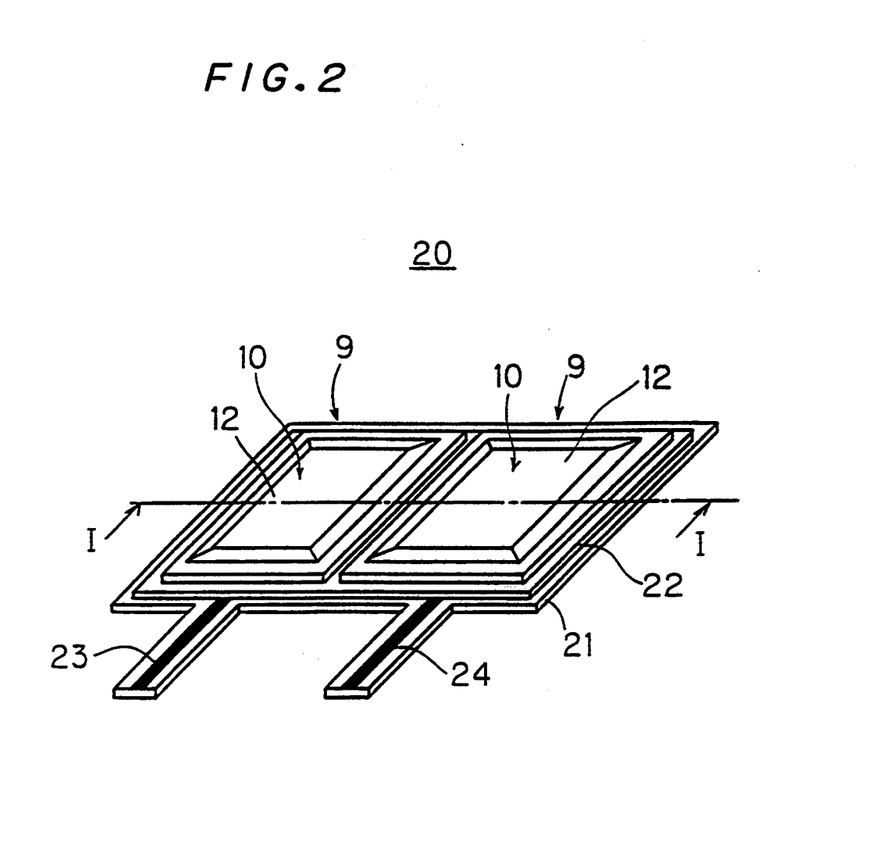
FIG. 2 is a perspective view of the thin power supply unit 20 shown in FIG. 1.

FIGS. 1 and 2 show a thin power supply unit 20 which has a rated voltage of 5 to 6 V. The power supply unit 20 comprises two flat power supply elements 9 shown in FIG. 10. The flat power supply elements 9, are known in the prior art. Features of the invention corresponding to the flat power supply elements 9 shown in FIG. 10 are denoted by the same reference numerals. The thin power supply unit 20 comprises a flexible circuit board 21 which provides plate type circuit means. An insulating bonding layer 22 is provided for bonding two flat power supply elements 9 to the circuit board 21.

Figure 3:
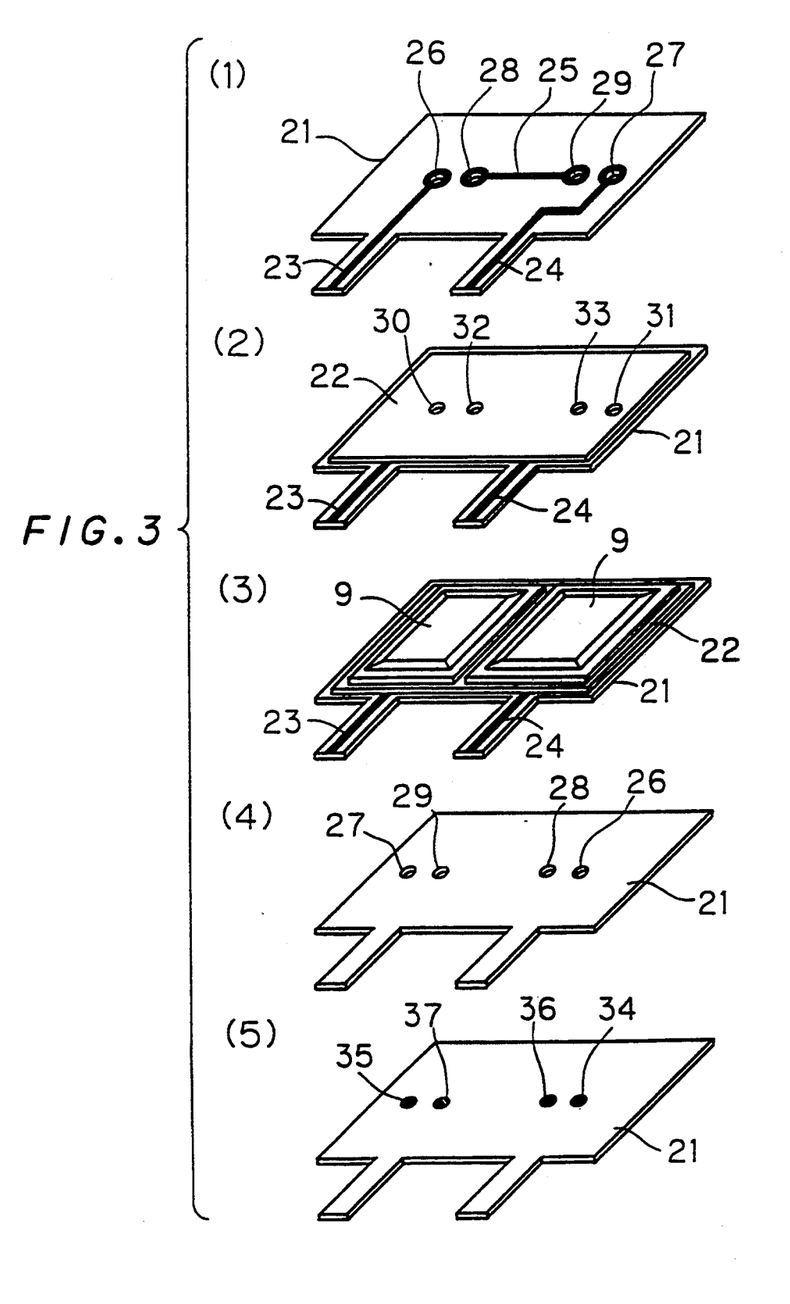
FIG. 3 is a perspective view showing steps for assembling the thin power supply unit 20 shown in FIG. 1.

The circuit board 21 is formed by etching for example, a copper-clad flexible board having a conductor of copper and a base film of polyimide. As shown in FIG. 3(1), the circuit board 21 is provided with first and second external connection terminals 23 and 24 and a connecting conductor 25. Through holes 26, 27, 28 and 29 passing through the circuit board 21 are formed on respective ends of the external connection terminals 23 and 24 as well as on both ends of the connecting conductor 25, respectively.

The bonding layer 22 is formed on the circuit board 21. The bonding layer 22 is provided with through holes 30, 31, 32 and 33 which are aligned with the through holes 26, 27, 28 and 29 provided in the circuit board 21, respectively. The bonding layer 22 is advantageously formed by for example, a hot-melt type thermobonding film, which can easily form a thin and flat layer having no pinholes. For example, such a thermobonding film may be prepared from a film of polyamide resin having a thickness of 0.035 mm.

The two flat power supply elements 9 are fixed onto the circuit board 21 by the bonding layer 22, not to be in contact with each other. Openings 14, provided in respective cases 10 of the flat power supply elements 9, are aligned with the through holes 30 and 33 of the bonding layer 22, respectively. The through holes 26, 27, 28 and 29 provided in the circuit board 21 are filled with conductive members 34, 35, 36 and 37, respectively. Thus, the conductive member 34 provides electrical conduction between the electrode plate 15 of the first power supply element 9 and the first external connection terminal 23 via the through hole 30 and the opening 14, while the conductive member 35 provides electrical conduction between a first case half 11 of the second power supply element 9 and the second external connection terminal 24 via the through hole 31. Further, the conductive member 36 provides electrical conduction between a first case half 11 of the first power supply element 9 and the connecting conductor 25 via the through hole 32, while the conductive member 37 provides electrical conduction between the electrode plate 15 of the second power supply element 9 and the connecting conductor 25 via the through hole 33 and the opening 14. Thus, the two power supply elements 9 are connected in series to each other in the thin power supply unit 20, so that the series circuit thereby formed is connected by the first and second external connection terminals 23 and 24.

The conductive members 34 to 37 may be advantageously prepared from conductive resin paste to which powder of silver, nickel, copper, carbon or the like is added.

FIGS. 3(1) to 3(5) show steps of assembling the aforementioned thin power supply unit 20.

The flexible circuit board 21 which is provided with the first and second external connection terminals 23 and 24, the connecting conductor 25 and the through holes 26 to 29 is prepared as shown in FIG. 3(1).

A thermobonding film for forming the bonding layer 22 is placed on the circuit board 21, as shown in FIG. 3(2). The thermobonding film is hot-pressed at 200° C. for 10 seconds so as to be temporarily bonded to the circuit board 21. The bonding layer 22 thereby obtained, is provided with the through holes 30 to 33.

The two flat power supply elements 9 are placed on the bonding layer 22 as shown in FIG. 3(3) and hot-pressed at 200° C. for 45 seconds so as to be fixed to the circuit board 21. At this time, the openings 14 of the power supply elements 9 are aligned with the through holes 30 and 33, respectively.

The circuit board 21 is then inverted as shown in FIG. 3(4), so that the through holes 26 to 29 are filed with the conductive members 34 to 37 as shown in FIG. 3(5).

According to the aforementioned embodiment, it is possible to apply the conductive members 34 to 37 at any time after the power supply elements 9 are bonded to the circuit board 21 through the bonding layer 22, since the circuit board 21 is provided with the through holes 26 to 29. However, if conductive paste for forming the conductive members 34 to 37 is applied to the through holes 30 to 33 which are provided in the bonding layer 22 before the power supply elements 9 are placed on the bonding layer 22, it is then not necessary to provide the through holes 26 to 29 in the circuit board 21.

Figure 4:
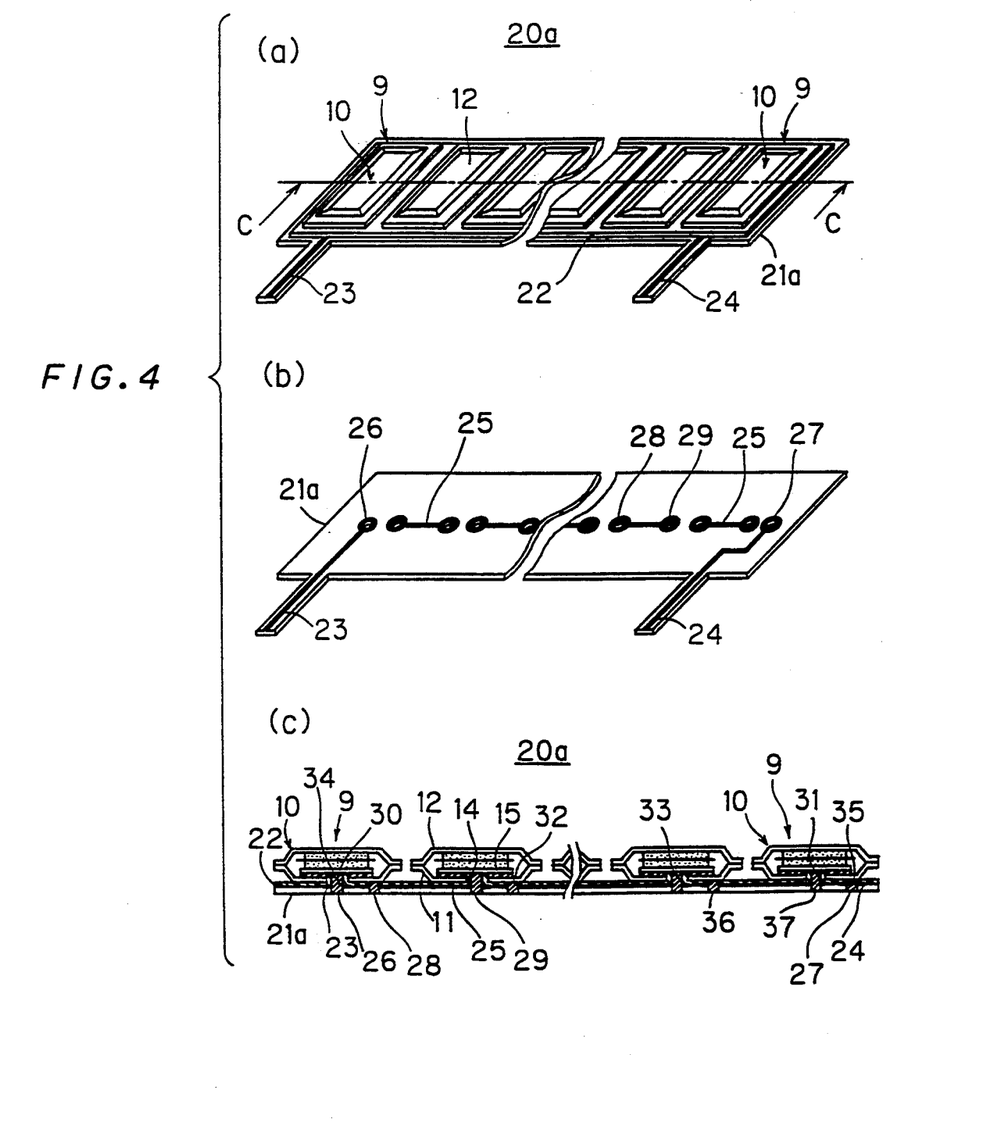

FIGS. 4(a) to 4(c) show a second embodiment of the present invention. Referring to FIGS. 4(a) to 4(c), a thin power supply unit 20a has a larger number of power supply elements 9 connected in series. Therefore, a flexible circuit board 21a is provided with a larger number of connecting conductors 25. Otherwise, the thin power supply unit 20a is substantially similar to the thin power supply unit 20 shown in FIGS. 1 to 3(5), and hence corresponding elements are denoted by similar reference numerals.

Thus, even if the number of the series-connected power supply elements 9 is increased, it is possible to arrange the power supply elements 9 along a surface direction while easily increasing the rated voltage, with no increase in thickness.

FIGS. 5(a) to 5(d) show a third embodiment of the present invention. Referring to FIGS. 5(a) to 5(d), a thin power supply unit 38 comprises two flat power supply elements 9, a flexible circuit board 39 and a bonding layer 40.

Figure 5:
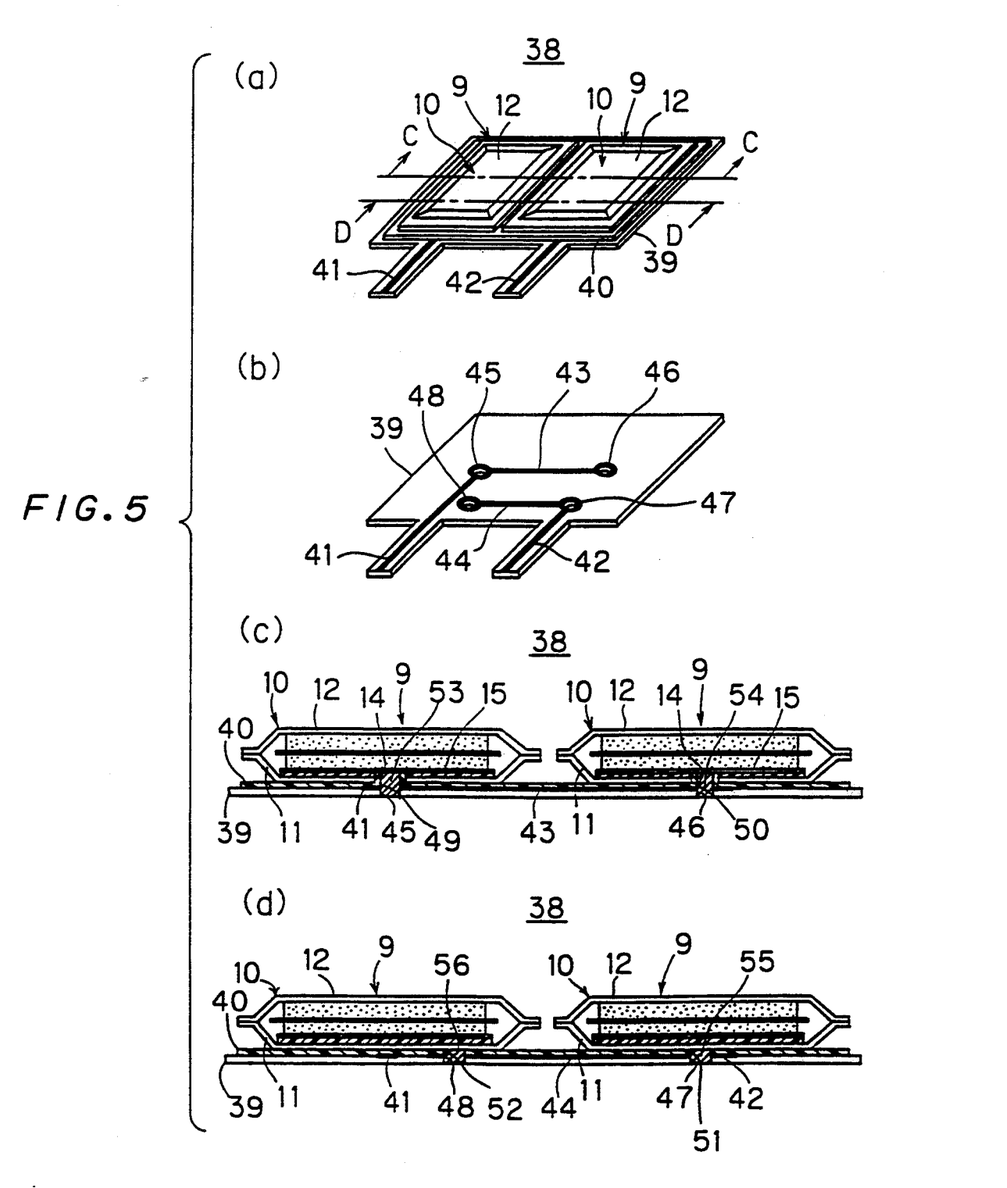
FIG. 5(a) is a perspective view showing a thin power supply unit 38 according to a third embodiment of the present invention.
FIG. 5(b) is a perspective view showing a flexible circuit board 39.
FIG. 5(c) is a sectional view along the line C—C in FIG. 5(a)
FIG. 5(d) is a sectional view along the line D—D in FIG. 5(a)
Figure 6:
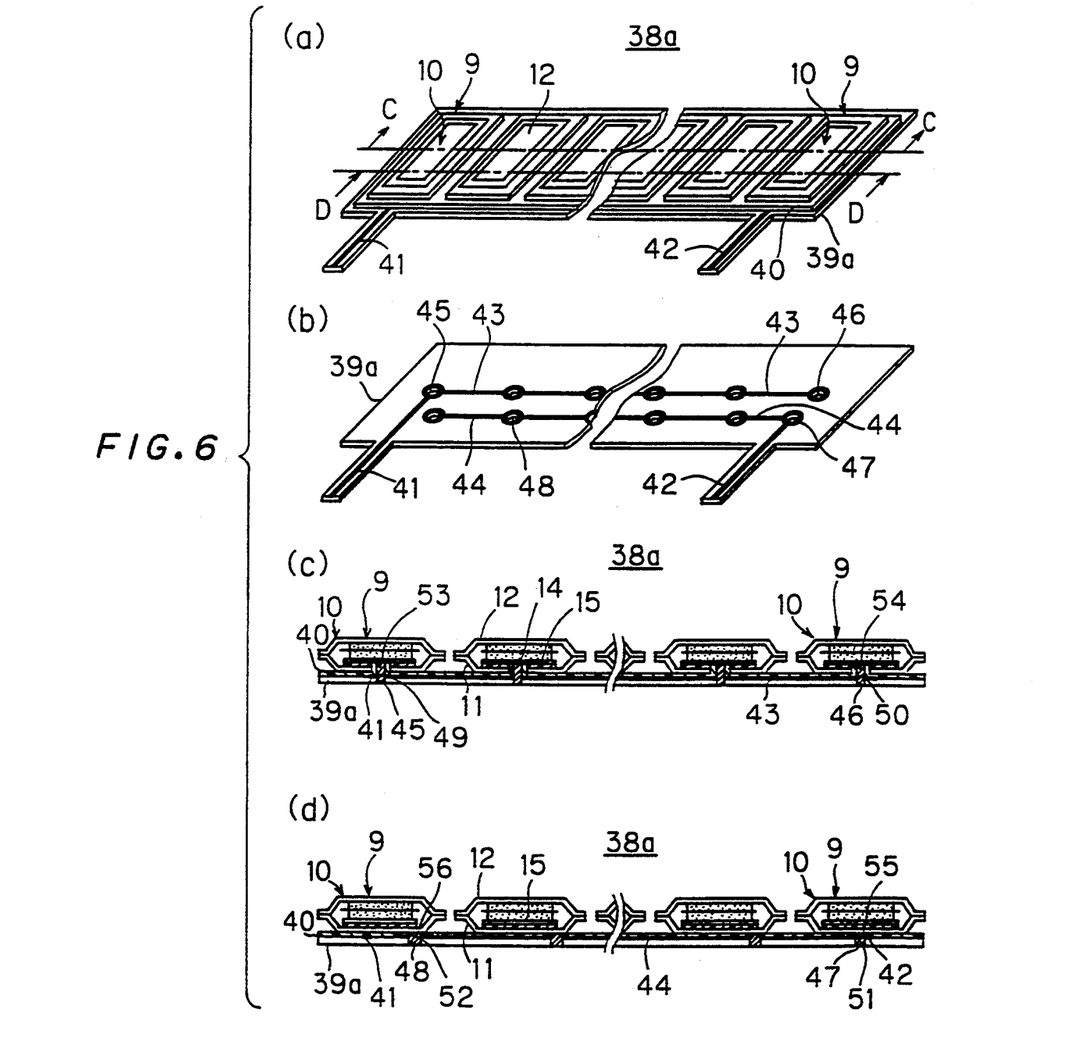

As shown in FIG. 5(b), the circuit board 39 is provided with first and second external connection terminals 41 and 42, and first and second connecting conductors 43 and 44 extending in series from the external connection terminals 41 and 42 respectively. Through hole 45 is provided at the meeting point between the first external connection terminal 41 and the first connecting conductor 43. Through hole 46 is provided at a free end of the connecting conductor 43. Similarly, through holes 47 and 48 are provided at the meeting point between the second external connection terminal 42 and the second connecting conductor 44, and at a free end of the connecting conductor 44, respectively.

As shown in FIGS. 5(c) and 5(d), the bonding layer 40 is provided with through holes 49, 50, 51 and 52 in positions which correspond to those of the through holes 45, 46, 47 and 48, respectively.

The through holes 45, 46, 47 and 48 which are provided in the circuit board 39 are filled with conductive members 53, 54, 55 and 56 respectively. Thus, the conductive member 53 provides electrical conduction between an electrode plate 15 of the first power supply element 9 and the first external connection terminal 41 as well as the first connecting conductor 43 via the through hole 49 and an opening 14, while the conductive member 54 provides electrical conduction between an electrode plate 15 of the second power supply element 9 and the first connecting conductor 43 via the through hole 50 and an opening 14. Further, the conductive member 55 provides electrical conduction between a first case half 11 of the second power supply element 9 and the second external connection terminal 42 as well as the second connecting conductor 44 via the through hole 51, while the conductive member 56 provides electrical conduction between a first case half 11 of the first power supply element 9 and the second connecting conductor 44 via the through hole 52.

In the thin power supply unit 38 according to the third embodiment, the two power supply elements 9 are connected in parallel with each other on the same circuit board 39, whereby the capacitance is improved.

FIGS. 6(a) to 6(d) show a fourth embodiment of the present invention.

Referring to FIGS. 6(a) to 6(d), a thin power supply unit 38a has a larger number of power supply elements 9 which are connected in parallel with each other as compared with the thin power supply unit 38 according to the third embodiment. Thus, the numbers of first and second connecting conductors 43 and 44 provided on a flexible circuit board 39a are also increased. Otherwise, the fourth embodiment is similar to the third embodiment shown in FIGS. 5(a) to 5(d), and hence corresponding elements are denoted by similar reference numerals.

Thus, according to the thin power supply unit 38a shown in FIGS. 6(a) to 6(d), it is possible to arrange the power supply elements 9 along a surface direction with no increase in thickness and the capacitance can be easily improved, even if the number of the power supply elements is increased.

When the connecting method employed in the fourth embodiment is combined with that employed in the second embodiment shown in FIGS. 4(a) to 4(c), a power supply unit having desired rated voltage and capacitance can be easily obtained with no increase in thickness.

Figure 7:
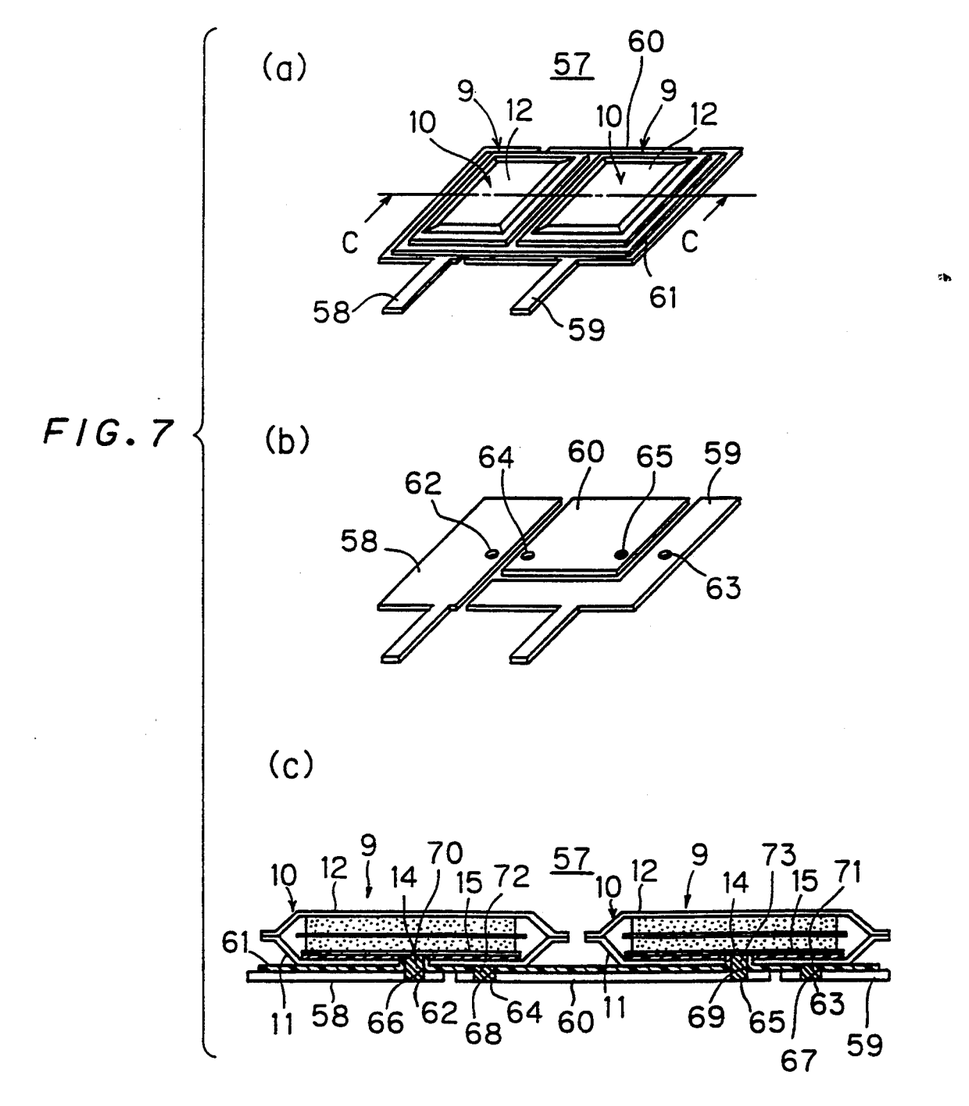
FIG. 7(a) is a perspective view showing a thin power supply unit 57 according to a fifth embodiment of the present invention.
FIG. 7(b) is a perspective view showing external connection terminals 58 and 59 and a connecting conductor 60.
FIG. 7(c) is a sectional view along the line C—C in FIG. 7(a)

FIGS. 7(a) to 7(c) show a fifth embodiment of the present invention.

A thin power supply unit 57 shown in FIGS. 7(a) to 7(c) comprises two flat power supply elements 9. The power supply unit 57 includes a first and second external connection terminals 58 and 59 and a connecting conductor 60, which are formed by metal plates or foils respectively, to serve as circuit means. The external connection terminals 58 and 59 and the connecting conductor 60 are bonded to the power supply elements 9 through an insulating bonding layer 61.

The first and second external connection terminals 58 and 59 are provided with through holes 62 and 63, respectively. The connecting conductor 60 is provided with through holes 64 and 65. The bonding layer 61 is provided with through holes 66, 67, 68 and 69 in positions which correspond to those of the through holes 62, 63, 64 and 65, respectively.

The through holes 62, 63, 64 and 65 are filled with conductive members 70, 71, 72 and 73, respectively. Thus, the conductive member 70 provides electrical conduction between an electrode plate 15 of the first power supply element 9 and the first external connection terminal 58 via the through hole 66 and an opening 14, while the conductive member 71 provides electrical conduction between a first case half 11 of the second power supply element 9 and the second external connection terminal 59 via the through hole 67. Further, the conductive member 72 provides electrical conduction between a first case half 11 of the first power supply element 9 and the connecting conductor 60 via the through hole 68, while the conductive member 73 provides electrical conduction between an electrode plate 15 of the second power supply element 9 and the connecting conductor 60 via the through hole 69 and an opening 14.

The thin power supply unit 57 obtained in the aforementioned manner has the same interconnection pattern as the thin power supply unit 20 according to the first embodiment shown in FIGS. 1 to 3(5).

In the embodiment shown in FIGS. 7(a) to 7(c), the external connection terminals 58 and 59 and the connecting conductor 60 are also adapted to mechanically hold the power supply elements 9. Thus, these elements 58, 59 and 60 are preferably increased in size, in ranges so as not to come into contact with each other.

Figure 8:
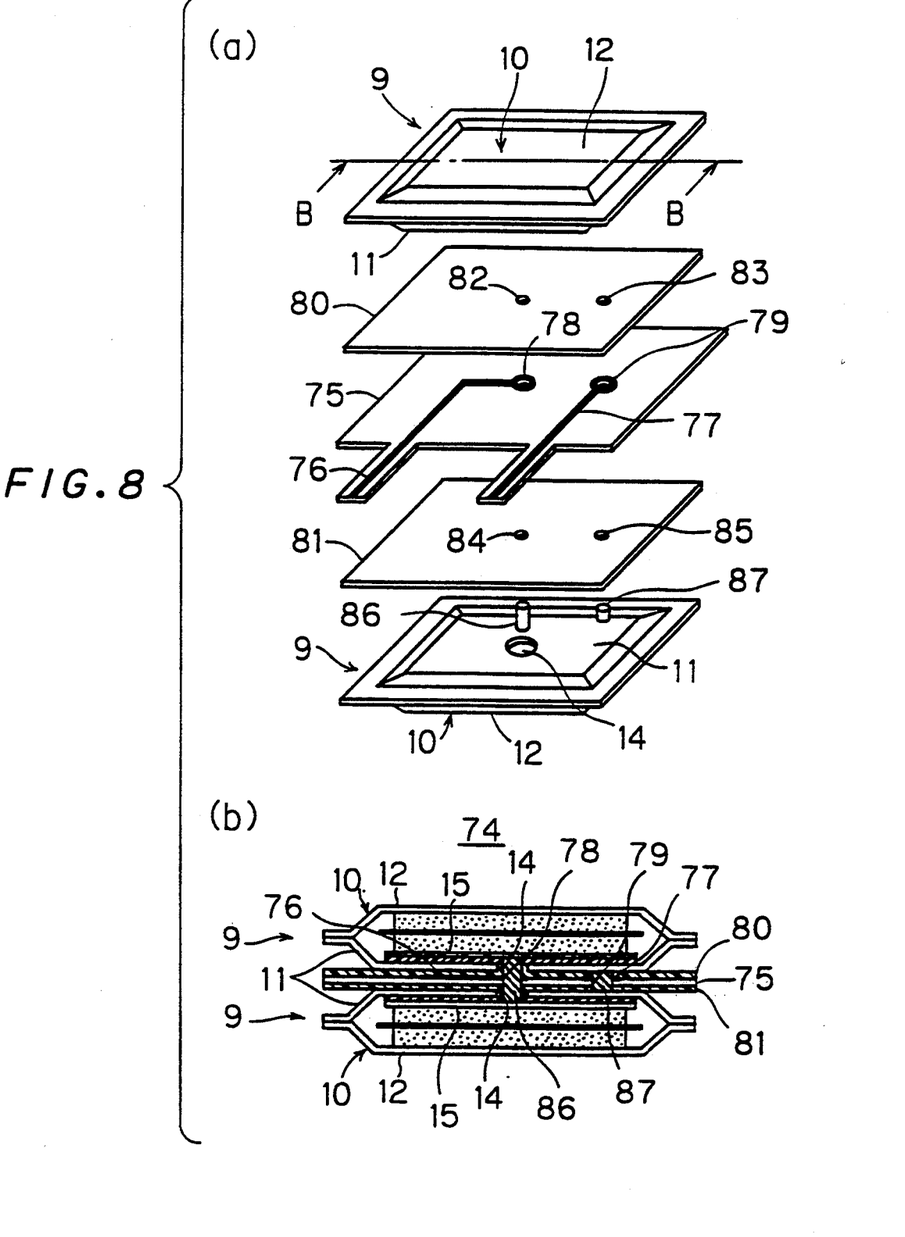
FIG. 8(a) is an exploded perspective view showing elements forming a thin power supply unit 74 according to a sixth embodiment of the present invention.
FIG. 8(b) is a sectional view along the line B—B in FIG. 8(a) for illustrating an assembled state of the thin power supply unit 74.

FIGS. 8(a) and 8(b) show a sixth embodiment of the present invention. A thin power supply unit 74 shown in FIGS. 8(a) and 8(b) comprises flat power supply elements 9 which are arranged on both surfaces of a flexible circuit board 75, respectively.

The circuit board 75 is provided with first and second external connection terminals 76 and 77, which are provided with through holes 78 and 79 on ends thereof, respectively.

A first power supply element 9 is arranged on the upper surface of the circuit board 75 through a first bonding layer 80, while a second power supply element 9 is arranged on the lower surface of the circuit board 75 through a second bonding layer 81.

The first bonding layer 80 is provided with a through hole 82 at a position so as to correspond to the through hole 78 and an opening 14. Another is provided at a position so as to correspond through hole 83 in correspondence to the through hole 79. The second bonding layer 81 is provided with a through hole 84 at a position so as to correspond to the through hole 78 and an opening 14, and with another through hole 85 at a position so as to correspond to the through hole 79.

A conductive member 86 is applied to fill up the opening 14 of the first power supply element 9, the through holes 82, 78 and 84 and the opening 14 of the second power supply element 9. Another conductive member 87 is applied to fill up the through holes 83, 79 and 85. Thus, the conductive member 86 electrically connects electrode plates 15 of the two power supply elements 9 and the first external connection terminal 76 with each other, while the conductive member 87 electrically connects first case halves 11 of the two power supply elements 9 and the second external connection terminal 77 with each other. Therefore, the thin power supply unit 74 has an interconnection pattern which is similar to that of the thin power supply unit 38 shown in FIGS. 5(a) to 5(d).

In the power supply unit 74 shown in FIGS. 8(a) and 8(b), the flexible circuit board 75 may have a double-sided through hole structure.

Although the various embodiments of the present invention have been described and illustrated in detail, it is clearly understood that the same is by way of illustration and example only and is not to be taken by way of limitation, the scope of the present invention being limited only by the terms of the appended claims.

What is claimed is:

1. A thin power supply unit having a height substantially equal to a height of flat power supply elements comprised therein, said thin power supply unit comprising:
    a) a first plurality of flat power supply elements arranged side by side, each power supply element comprising a flat case, said flat case having an interior and serving as a first element terminal for said power supply element;

1) each power supply element having an electrode plate inside said case, a surface of said electrode plate closely spaced from an inner surface of said case, said electrode plate serving as a second element terminal for said power supply element;
2) an electrically insulating layer disposed between said respective surfaces of said case and said electrode plate for electrically insulating said respective surfaces from each other; and
3) an opening into said interior of said case exposing a portion of said surface of said electrode plate;

b) plate type circuit means having external connection terminals;

c) a conductive member for electrically connecting said circuit means with each of said flat power supply elements, respectively, so that said first element terminals and said second element terminals of said plurality of flat power supply elements are electrically connected with each other and with said external connection terminals; and d) an electrically insulating bonding layer for bonding said plurality of flat power supply elements to said circuit means, wherein each flat power supply element is arranged on said circuit means with an outer surface, opposed to said inner surface, substantially parallel to a major surface to said plate type circuit means; said flat case having a relatively wide surface defining the flat shape of said case, and said opening being formed in said relatively wide surface to face toward said circuit means, and said circuit means and said bonding layer have through holes in respective portions provided with said conductive member.

2. A thin power supply unit in accordance with claim 1, wherein said plurality of flat power supply elements are arranged on only one major surface of said plate type circuit means.

3. A thin power supply unit in accordance with claim 2, wherein said circuit means comprises a conductor for electrically connecting said plurality of flat power supply elements with each other.

4. A thin power supply unit in accordance with claim 3, wherein said conductor connects said plurality of flat power supply elements in series with each other.

5. A thin power supply unit in accordance with claim 3, wherein said conductor connects said plurality of flat power supply elements in parallel with each other.

6. A thin power supply unit in accordance with claim 1, wherein said conductive member is prepared from conductive paste.

7. A thin power supply unit in accordance with claim 1, further comprising a second plurality of flat power supply elements arranged side by side, said first and second plurality of flat power supply elements being arranged on both major surfaces of said plate type circuit means, respectively.

8. A thin power supply unit in accordance with claim 1, wherein said plate type circuit means includes a flexible circuit board.

9. A thin power supply unit in accordance with claim 1, wherein said plate type circuit means includes a plurality of metal plates or foils which are separated from each other.

10. A thin power supply unit in accordance with claim 1, wherein said insulating bonding layer is formed by a thermobonding resin film.

11. A power supply unit having a height substantially equal to a height of flat power supply elements comprised therein, said power supply unit comprising:

a) a plurality of power supply elements arranged side by side, each power supply element comprising:
1) a first terminal and a second terminal, said first terminal having a relatively wide surface defining the flat shape and having an interior, said second terminal being disposed inside said interior of said first terminal, a surface of said second terminal being closely spaced from an inner surface of said first terminal;
2) an electrically insulating layer disposed between said respective surfaces of said first and said second terminals for electrically insulating said respective surfaces from each other; and
3) said first terminal having an opening through said relatively wide surface into said interior of said first terminal for exposing a portion of said surface of said second terminal so as to be electrically connectable from outside said first terminal;

b) flat circuit means including external terminals for said power supply unit, each flat power supply element being arranged on said circuit means and having an outer surface, which is opposed to said inner surface, substantially parallel to a major surface of said circuit means; said opening in said first terminal facing toward said circuit means;

c) a conductive member for electrically connecting said circuit means with each of said flat power supply elements so that said first terminals and said second terminals of said plurality of power supply elements are electrically connected with each other and with said external terminals; and d) an electrically insulating bonding layer for bonding said plurality of flat power supply elements to said circuit means, wherein said circuit means and said bonding layer have through holes in respective portions provided with said conductive member.

12. A thin power supply unit in accordance with claim 11, wherein said circuit means comprises a conductor for electrically connecting said plurality of flat power supply elements with each other.

13. A thin power supply unit in accordance with claim 12, wherein said conductor connects said plurality of flat power supply elements in series with each other.

14. A thin power supply unit in accordance with claim 12, wherein said conductor connects said plurality of flat power supply elements in parallel with each other.

15. A thin power supply unit in accordance with claim 11, wherein said plate type circuit means includes a flexible circuit board.

16. A power supply unit in accordance with claim 11, wherein said plurality of flat power supply elements are arranged on only one major surface of said circuit means.

17. A power supply unit in accordance with claim 11, wherein said conductive member is prepared from conductive paste.

18. A power supply unit in accordance with claim 11, further comprising a second plurality of flat power supply elements arranged side by side, said first-mentioned and second plurality of flat power supply elements being arranged on both major surfaces of said circuit means, respectively.

19. A power supply unit in accordance with claim 11, wherein said circuit means includes a plurality of metal plates or foils which are separated from each other.

20. A power supply unit in accordance with claim 11, wherein said insulating bonding layer is formed by a thermobonding resin film.

* * * * *